(12) United States Patent
Yamaga et al.

(10) Patent No.: US 7,768,001 B2
(45) Date of Patent: Aug. 3, 2010

(54) ORGANIC TRANSISTOR, ORGANIC TRANSISTOR ARRAY, AND DISPLAY APPARATUS

(75) Inventors: Takumi Yamaga, Kanagawa (JP); Ikue Kawashima, Kanagawa (JP); Yoshinobu Nakayama, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 228 days.

(21) Appl. No.: 12/135,423

(22) Filed: Jun. 9, 2008

(65) Prior Publication Data
US 2009/0014715 A1 Jan. 15, 2009

(30) Foreign Application Priority Data
Jul. 11, 2007 (JP) ............... 2007-182445

(51) Int. Cl.
*H01L 21/765* (2006.01)
*H01L 27/28* (2006.01)

(52) U.S. Cl. ............ 257/40; 257/504; 257/E51.006; 257/E51.028; 257/E25.008; 438/99

(58) Field of Classification Search ........... 257/40, 257/504, E51.006, E51.028, E25.008; 438/99, 438/151, 158
See application file for complete search history.

(56) References Cited

U.S. PATENT DOCUMENTS

| | | | |
|---|---|---|---|
| 6,362,509 B1 * | 3/2002 | Hart | 257/369 |
| 7,166,689 B2 | 1/2007 | Sagisaka et al. | |
| 2007/0040165 A1 * | 2/2007 | Dimmler et al. | 257/40 |
| 2007/0054212 A1 | 3/2007 | Akiyama et al. | |
| 2007/0092760 A1 | 4/2007 | Sagisaka et al. | |
| 2007/0254402 A1 * | 11/2007 | Dimmler et al. | 438/99 |
| 2008/0029766 A1 | 2/2008 | Onodera et al. | |
| 2008/0164461 A1 * | 7/2008 | Wilson | 257/40 |
| 2009/0315017 A1 * | 12/2009 | Song | 257/24 |

FOREIGN PATENT DOCUMENTS

| | | |
|---|---|---|
| JP | 2004-141856 | 5/2004 |
| JP | 2004-297011 | 10/2004 |

OTHER PUBLICATIONS

U.S. Appl. No. 12/067,657, filed Mar. 21, 2008, Yamaga, et al.

* cited by examiner

*Primary Examiner*—George Fourson
(74) *Attorney, Agent, or Firm*—Oblon, Spivak, McClelland, Maier & Neustadt, L.L.P.

(57) ABSTRACT

An off-current is reduced in an organic transistor, with which an organic transistor array is formed. A display apparatus is constructed using the organic transistor array. The organic transistor includes a substrate, a gate electrode, a separating electrode, a gate insulating film, a source electrode, a drain electrode, and an organic semiconductor layer. The organic transistor has a region in which the separating electrode and the organic semiconductor layer are laminated. A power supply is connected to the separating electrode.

13 Claims, 10 Drawing Sheets

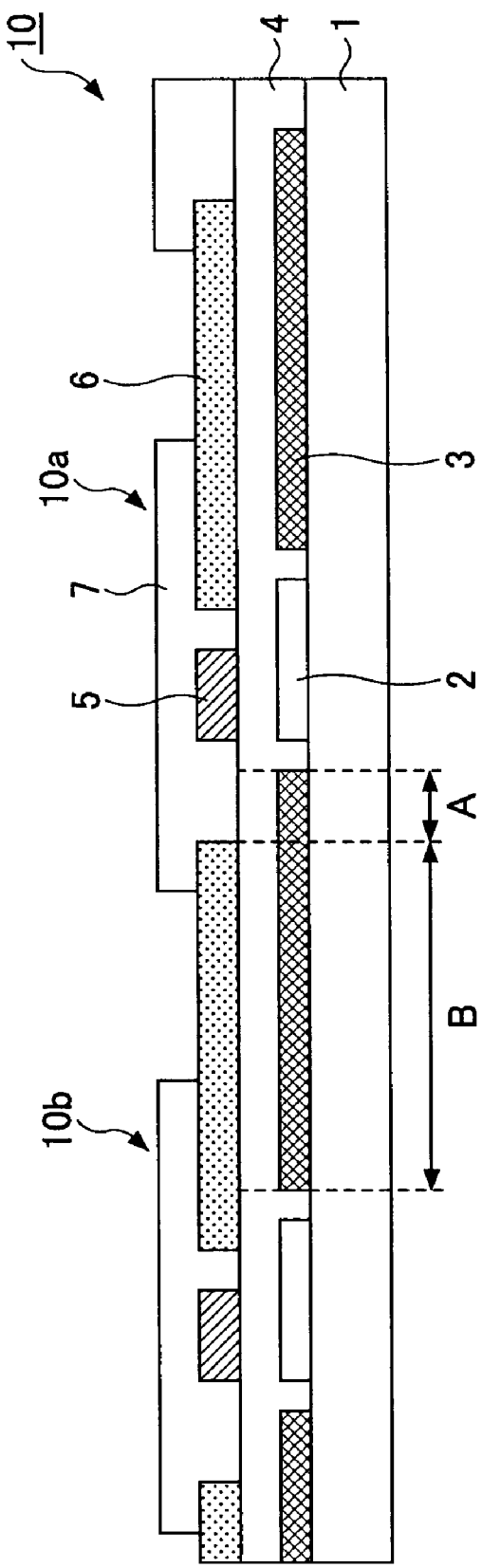

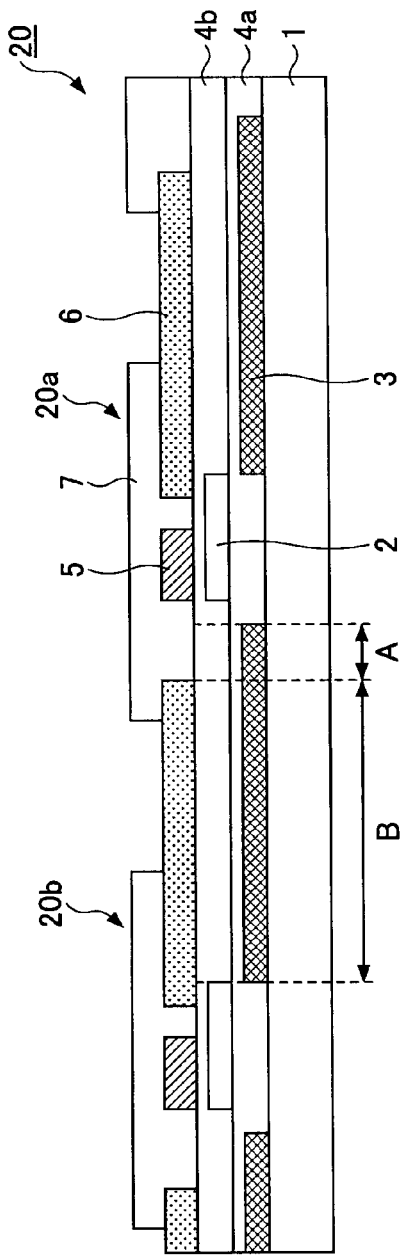
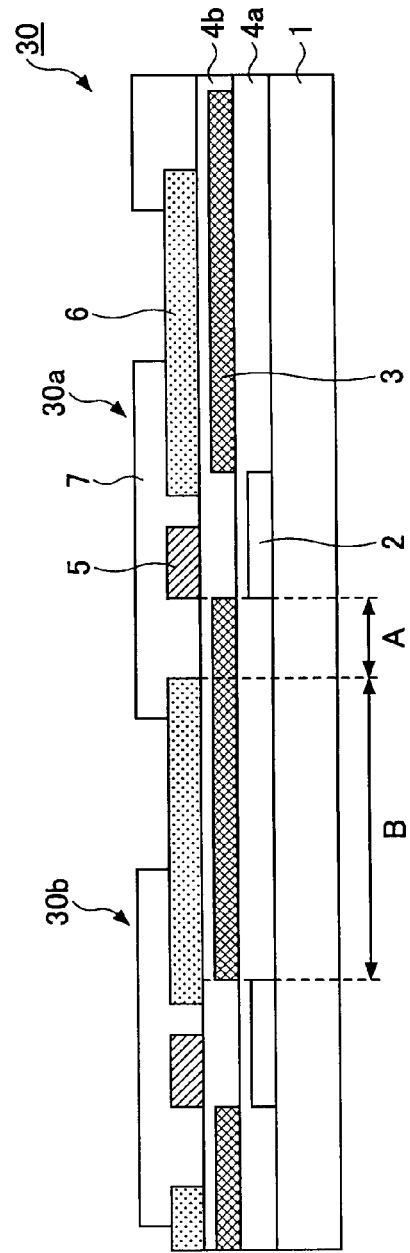

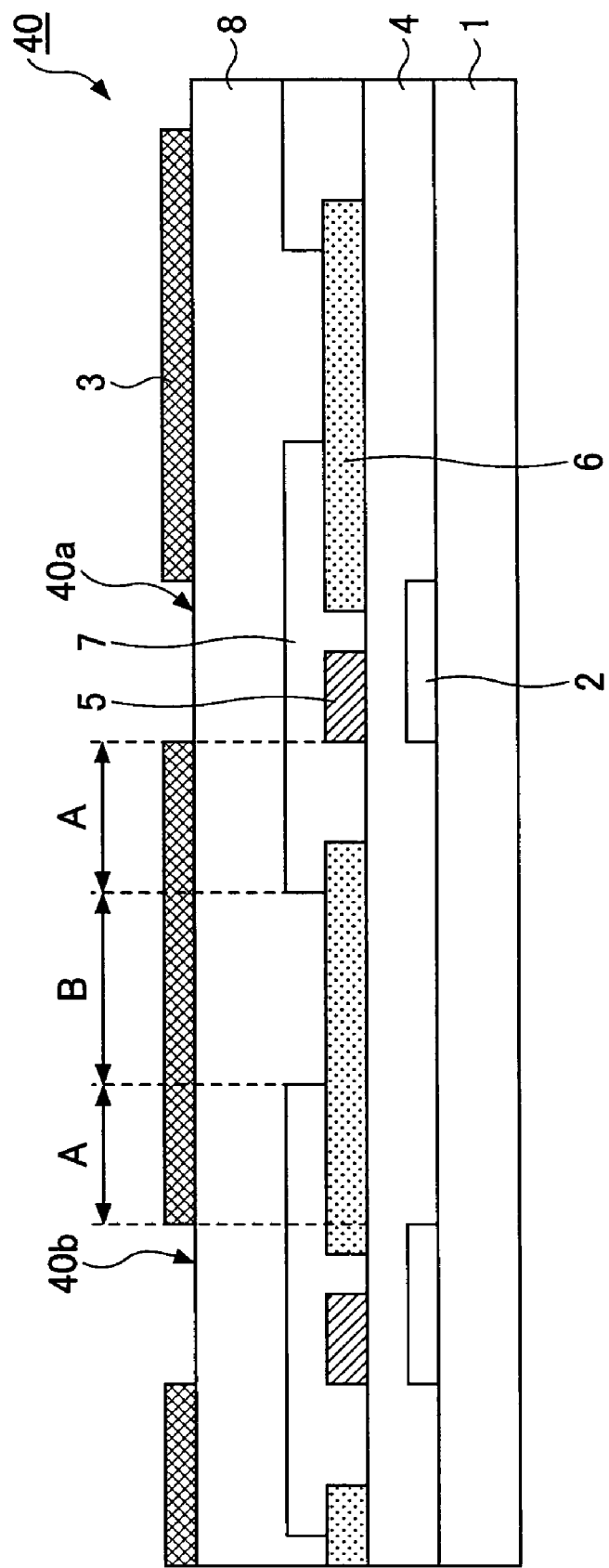

ORGANIC TRANSISTOR, ORGANIC TRANSISTOR ARRAY, AND DISPLAY APPARATUS

BACKGROUND OF THE INVENTION

1. Field of the Invention

The present invention relates to organic transistors, organic transistor arrays, and display apparatuses.

2. Description of the Related Art

In the recent years, organic thin-film transistors that use organic semiconductor materials are being vigorously studied. Advantages of such organic thin-film transistors include diversity in material composition; flexibility in manufacturing process and product form; the ease with which areal increases can be achieved; simplicity of manufacturing process based on a simple layered structure; and inexpensive manufacturing equipment.

Organic thin-film transistors can be easily manufactured in the form of thin-films or circuits using a print method, a spin-coat method, a dipping method, etc, at a cost far smaller than the cost of manufacturing thin-film transistors using conventional Si semiconductor material. Integration of organic thin-film transistors requires the patterning of an organic semiconductor layer. If transistors are integrated without patterning of an organic semiconductor layer, off-current increases during the operation of the transistors, resulting in an increase in power consumption. The increase in off-current may also cause crosstalk when the transistors are used to drive a display medium. When patterning a semiconductor layer using Si semiconductor material, photolithography and etching are employed. Specifically, after a photoresist is applied and a desired pattern is exposed and developed to form a resist pattern, etching is performed using the resist pattern as an etching mask. The resist is then removed, thereby producing an etched pattern.

Photolithography and etching may also be employed for the patterning of an organic semiconductor layer, in the same way as in the case of Si semiconductor material. However, when a polymer material is used as an organic semiconductor material, if a photoresist is applied to a polymer organic semiconductor layer to form a pattern or the like, transistor characteristics may deteriorate. This is due to the fact that polymer materials are in many cases dissolved by an organic solvent contained in a photoresist, which generally consists of a novolac resin having naphthoquinone diazide as a photosensitive group that is dissolved in an organic solvent (such as xylene or cellosolve solvent). When a low-molecular crystalline material, such as pentacene, is used as an organic semiconductor material, deterioration in transistor characteristics may be observed to varying degrees. Further, such a material may be damaged by the resist stripper (such as ethyleneglycol monobutyl ether, or mono ethanol amine), which is used for removing the resist. The material may also be damaged by rinsing with pure water after the resist is removed.

In a method of patterning an organic semiconductor layer using a crystalline material, such as pentacene, a shadow mask is used. However, this method is limited by pattern size, and is not suitable for patterning of large areas. In addition, a shadow mask has a certain operating life. Thus, it is very difficult with this method to achieve a drastic cost reduction compared with the manufacture of thin-film transistors using Si semiconductor material.

Inkjet printing is a viable method of patterning an organic semiconductor layer. Japanese Laid-Open Patent Application No. 2004-297011 discloses a method of manufacturing an organic transistor based on an appropriate combination of a method whereby an electric charge is imparted at a predetermined position on a surface to be coated, and a charge having an opposite polarity is imparted to a coating material so that the charged material can be guided by Coulomb force to the predetermined position; a method whereby a concave portion is formed at a predetermined position on a surface to be coated in order to deposit a coating material in the concave portion; and a method whereby, after application of a material, solvent is evaporated to form a pattern, followed by irradiating the pattern with laser. Japanese Laid-Open Patent Application No. 2004-141856 discloses a patterning method whereby an indented region is formed on the surface of a substrate, and a liquid material is deposited on the surface at a selected location adjacent the indented region to form a pattern.

Because such an inkjet print method makes it possible to directly draw a pattern, dramatic improvements in material utilization can be achieved. Thus, an inkjet print method of patterning an organic semiconductor layer may potentially simplify manufacturing process, increase throughput, and reduce cost.

When a polymer material that is soluble in an organic solvent is used as an organic semiconductor material, an organic semiconductor ink can be prepared by dissolving such a polymer material in an organic solvent, so that an inkjet print method can be used for patterning. However, in this method, it is difficult to form a pattern with resolution of 50 µm or smaller, considering the printing accuracy, so that it is difficult to achieve higher resolution than possible with photolithography. One possible solution may be to reduce the size of ink droplets; this, however, is technically difficult and associated with stability problems, including the increased likelihood of blocked discharge or skewed discharge.

Furthermore, when an area to be patterned is large, it is very difficult to pattern every transistor satisfactorily, due to landing accuracy, for example. In particular, because the physical properties of an organic semiconductor ink (such as viscosity, surface tension, and drying property) vary depending on the physical properties (such as purity, molecular weight, and molecular weight distribution) of the polymer material used or the type of organic solvent, it is difficult to achieve an appropriate physical property of such an ink. As a result, not all of the nozzles used in the inkjet method may be able to discharge properly; some nozzles may discharge in a skewed manner or with different volumes. The same applies to the head characteristics; namely, the nozzles do not necessarily have identical head characteristics. Should one of the nozzles develop even a small amount of discharge skew, patterning at higher resolutions may fail even when patterning can be successfully performed at lower resolutions. As a result, when an island-shaped organic semiconductor layer is desired to be formed, an incomplete pattern (see FIG. 9B) may result instead of a fine-resolution pattern (see FIG. 9A). In the organic transistor array shown in FIGS. 9A and 9B, there are successively formed on a substrate (not shown) a gate electrode 2; a gate insulating film 4; a source electrode 5 and a drain electrode 6; and an organic semiconductor layer 7.

SUMMARY OF THE INVENTION

It is a general object of the present invention to overcome the aforementioned problems. A more specific object is to provide an organic transistor in which off-current can be reduced, an organic transistor array having such an organic transistor, and a display apparatus having such an organic transistor array.

In one aspect, the invention provides an organic transistor comprising a gate electrode, a source electrode, and a drain electrode formed on a substrate; an insulating film; an organic semiconductor layer; and a separating electrode. The organic semiconductor layer and the separating electrode are laminated via the insulating film in a first region, and a power supply is connected to the separating electrode.

In a preferred embodiment, the power supply is configured to apply a voltage to the separating electrode such that the organic semiconductor layer can be electrically shielded.

In another preferred embodiment, the organic transistor has a second region in which the drain electrode and the separating electrode are laminated via the insulating film.

In another preferred embodiment, the separating electrode is formed by a print method.

In another preferred embodiment, the separating electrode is formed using an ink in which metal particles are dispersed.

In yet another embodiment, the separating electrode contains a conductive polymer.

In yet another embodiment, the organic semiconductor layer is formed in an island shape or in a stripe shape.

In another embodiment, the organic semiconductor layer is formed by a print method.

In another embodiment, the organic semiconductor layer contains an organic semiconductor material that is soluble in an organic solvent.

In another embodiment, the organic semiconductor material comprises a polymer material that has a triarylamine skeleton.

In another aspect, the invention provides an organic transistor array having plural of the above organic transistors.

In a preferred embodiment, the drain electrode and the separating electrode in the organic transistor array are laminated via the insulating film in a second region, and the first region and the second region are continuously formed.

In yet another aspect, the invention provides a display apparatus having the above organic transistor array.

Thus, the present invention may provide an organic transistor in which off-current is reduced, an organic transistor array having such organic transistors, and a display apparatus having such an organic transistor array.

BRIEF DESCRIPTION OF THE DRAWINGS

These and other objects, features and advantages of the invention will be apparent to those skilled in the art from the following detailed description of the invention, when read in conjunction with the accompanying drawings in which:

FIG. 1B shows a cross section of the organic transistor array according to the embodiment shown in FIG. 1A;

FIG. 2 shows a cross section of an organic transistor array according to another embodiment of the invention;

FIG. 3 shows a cross section of an organic transistor array according to another embodiment of the invention;

FIG. 4 shows a cross section of an organic transistor array according to another embodiment of the invention;

DETAILED DESCRIPTION OF THE PREFERRED EMBODIMENTS

In the following, embodiments of the present invention are described with reference to the drawings.

In one embodiment, an organic transistor comprises a substrate, a gate electrode, an insulating film, a source electrode, a drain electrode, an organic semiconductor layer, and a separating electrode. The organic transistor according to the embodiment has a region A in which the organic semiconductor layer and the separating electrode are laminated via the insulating film. A bias power supply is connected to the separating electrode in order to reduce a leak current caused by an incomplete patterning in the organic semiconductor layer, whereby off-current can be reduced. When a display medium is driven by an organic transistor array according to an embodiment of the present invention, crosstalk among pixels can be reduced. In this case, an insulating film may consist of a gate insulating film or an interlayer insulating film. The bias power supply actively applies a voltage to the separating electrode in order to deplete the organic semiconductor layer, so that the organic semiconductor layer can be electrically shielded.

In a preferred embodiment, an organic transistor includes a region B in which the drain electrode and the separating electrode are laminated via the insulating film. In this way, the organic semiconductor layer can be electrically shielded and a retentive capacity can be formed between the separating electrode and the drain electrode. Consequently, it becomes easier to retain a pixel potential for a certain duration of time when a display medium is driven by the organic transistor according to the present embodiment. Furthermore, in this embodiment, a signal is practically given only when displays are switched, thereby contributing to a decrease in power consumption.

An organic transistor array according to an embodiment of the present invention includes plural organic transistors according to an embodiment of the present invention. Preferably, in such an organic transistor array, region A and region B are continuously formed. In this way, a separating electrode pattern can be simplified.

Figure 1A:
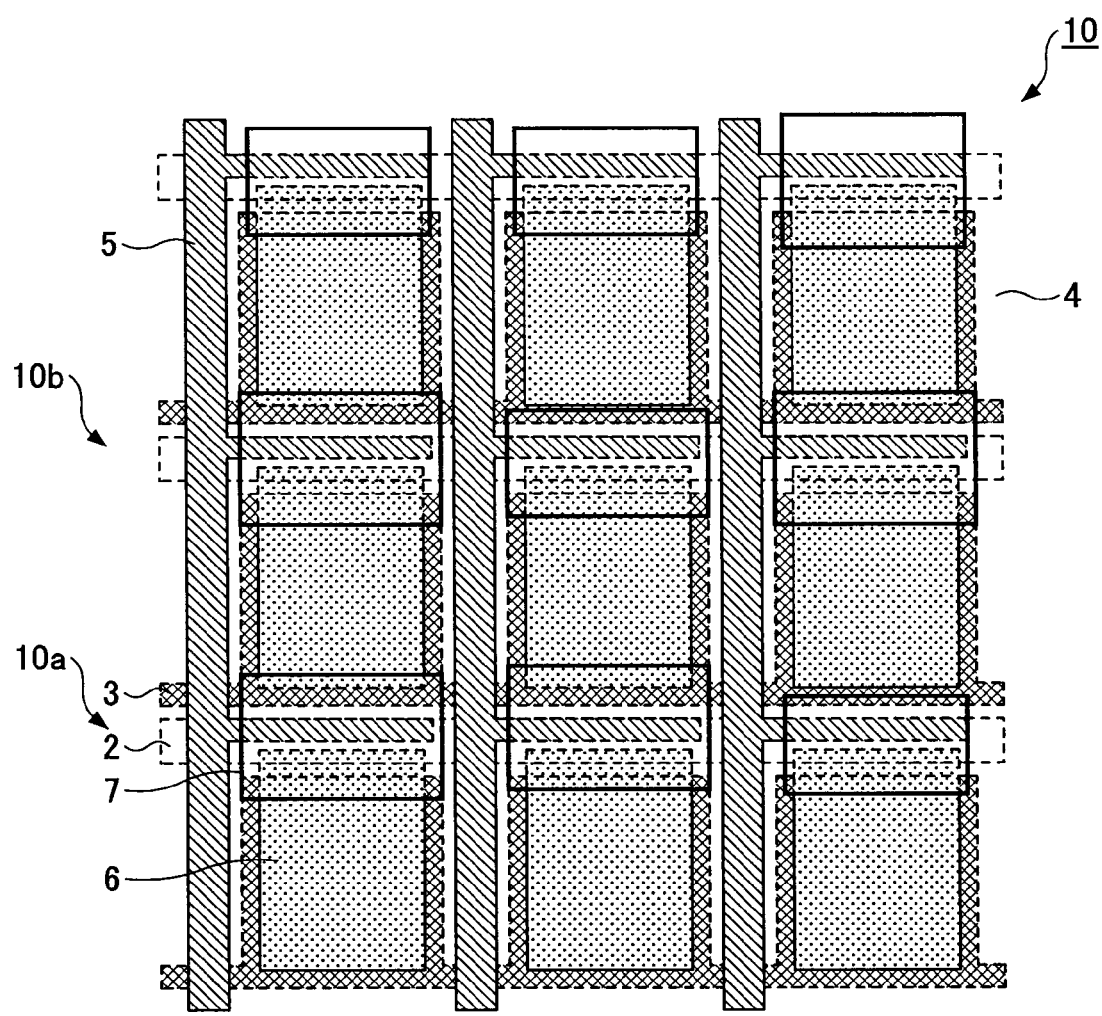
FIG. 1A shows plan view of an organic transistor array according to an embodiment of the present invention.

FIGS. 1A and 1B show an organic transistor array 10 according to a first embodiment of the present invention. FIG. 1A shows a plan view and FIG. 1B shows a cross section. The organic transistor array 10 includes plural organic transistors, such as organic transistors 10a and 10b. The organic transistor 10a includes a gate electrode 2 and a separating electrode 3, which are formed spaced apart on a substrate 1 at a predetermined distance. On top of these, a gate insulating film 4 is formed. On top of the gate insulating film 4, there are formed a source electrode 5 and a drain electrode 6 spaced apart at a predetermined distance. A space that separates the source electrode 5 and the drain electrode 6 from each other is formed above the gate electrode 2. An organic semiconductor layer 7 is formed in such a manner as to cover the source electrode 5, the drain electrode 6, and a drain electrode 6 of the adjacent organic transistor 10b. A region A, in which the separating electrode 3 and the organic semiconductor layer 7 are laminated via the gate insulating film 4, is formed continuously with a region B, in which the separating electrode 3 and the drain electrode 6 are laminated via the gate insulating film 4. The separating electrode 3 is connected to a bias power supply (not shown), so that a voltage with which the organic semiconductor layer 7 can be electrically shielded can be applied to the separating electrode 3. In this way, the organic semiconductor layer 7 can be electrically shielded, and a retentive capacity can be formed between the separating electrode 3 and the drain electrode 6. The same applies to the other organic transistors in the array.

FIG. 2 shows an organic transistor array 20 according to a second embodiment. The organic transistor array 20 is similar to the organic transistor array 10, with the exception of the gate electrode, the separating electrode, and the gate insulating film. Specifically, in the second embodiment, an organic transistor 20a includes a separating electrode 3 formed on a substrate 1, and a gate insulating film 4a is formed further thereon. On top of the gate insulating film 4a, a gate electrode 2 is formed, and a gate insulating film 4b is formed further thereon. A region A, in which the separating electrode 3 and the organic semiconductor layer 7 are laminated via the gate insulating films 4a and 4b, is formed continuously with a region B, in which the separating electrode 3 and the drain electrode 6 are laminated via the gate insulating films 4a and 4b. In this way, the space formed in the case of the organic transistor array 10 that separates the gate electrode 2 and the separating electrode 3 from each other along the plane of the substrate can be omitted, whereby regions A and B can be increased in size. Thus, the voltage applied to the separating electrode 3 can be effectively utilized.

FIG. 3 shows an organic transistor array 30 according to a third embodiment of the present invention. The organic transistor array 30 is similar to the organic transistor array 10, with the exception of the gate electrode, the separating electrode, and the gate insulating film. Specifically, an organic transistor 30a includes a gate electrode 2 formed on a substrate 1, and a gate insulating film 4a is formed on top of them. On top of the gate insulating film 4a, there is formed a separating electrode 3, on top of which a gate insulating film 4b is further formed. A region A, in which the separating electrode 3 and the organic semiconductor layer 7 are laminated via the gate insulating film 4b, is formed continuously with a region B, in which the separating electrode 3 and the drain electrode 6 are laminated via the gate insulating film 4b. Thus, as in the case of the organic transistor array 20, the space formed in the organic transistor array 10 that separates the gate electrode 2 and the separating electrode 3 from each other along the plane of the substrate can be omitted, whereby the regions A and B can be increased in size. As a result, the voltage applied to the separating electrode 3 can be more effectively utilized.

FIG. 4 shows an organic transistor array 40 according to a fourth embodiment of the present invention. The organic transistor array 40 is similar to the organic transistor array 10, with the exception of the separating electrode and the interlayer insulating film. Specifically, an organic transistor 40a includes a gate electrode 2 formed on a substrate 1, on top of which there is further formed a gate insulating film 4. On top of the gate insulating film 4, a source electrode 5 and a drain electrode 6 are formed spaced apart at a predetermined distance. In this case, a space that separates the source electrode 5 and the drain electrode 6 from each other is formed above the gate electrode 2. An organic semiconductor layer 7 is formed in such a manner as to cover the source electrode 5, the drain electrode 6, and a drain electrode 6 of an adjacent organic transistor 40b. On top of these, an interlayer insulating film 8 is formed, and a separating electrode 3 is formed on top of the interlayer insulating film 8. In this case, there are continuously formed a region A, in which the organic semiconductor layer 7 and the separating electrode 3 are laminated via the interlayer insulating film 8, a region B in which the drain electrode 6b and the separating electrode 3 are laminated via the interlayer insulating film 8, and another region A in which the organic semiconductor layer 7 and the separating electrode 3 are laminated via the interlayer insulating film 8. In this way, as in the case of the organic transistor array 20, the spacing provided in the organic transistor array 10 that separates the gate electrode 2 from the separating electrode 3 along the plane of the substrate can be omitted, whereby region A can be increased in size. As a result, the organic semiconductor layer can be effectively electrically shielded. This embodiment is particularly effective when the organic semiconductor layer is formed in stripes (see FIG. 5) because the organic semiconductor layer can be electrically shielded from both sides by combining the aforementioned structures.

Figure 5:
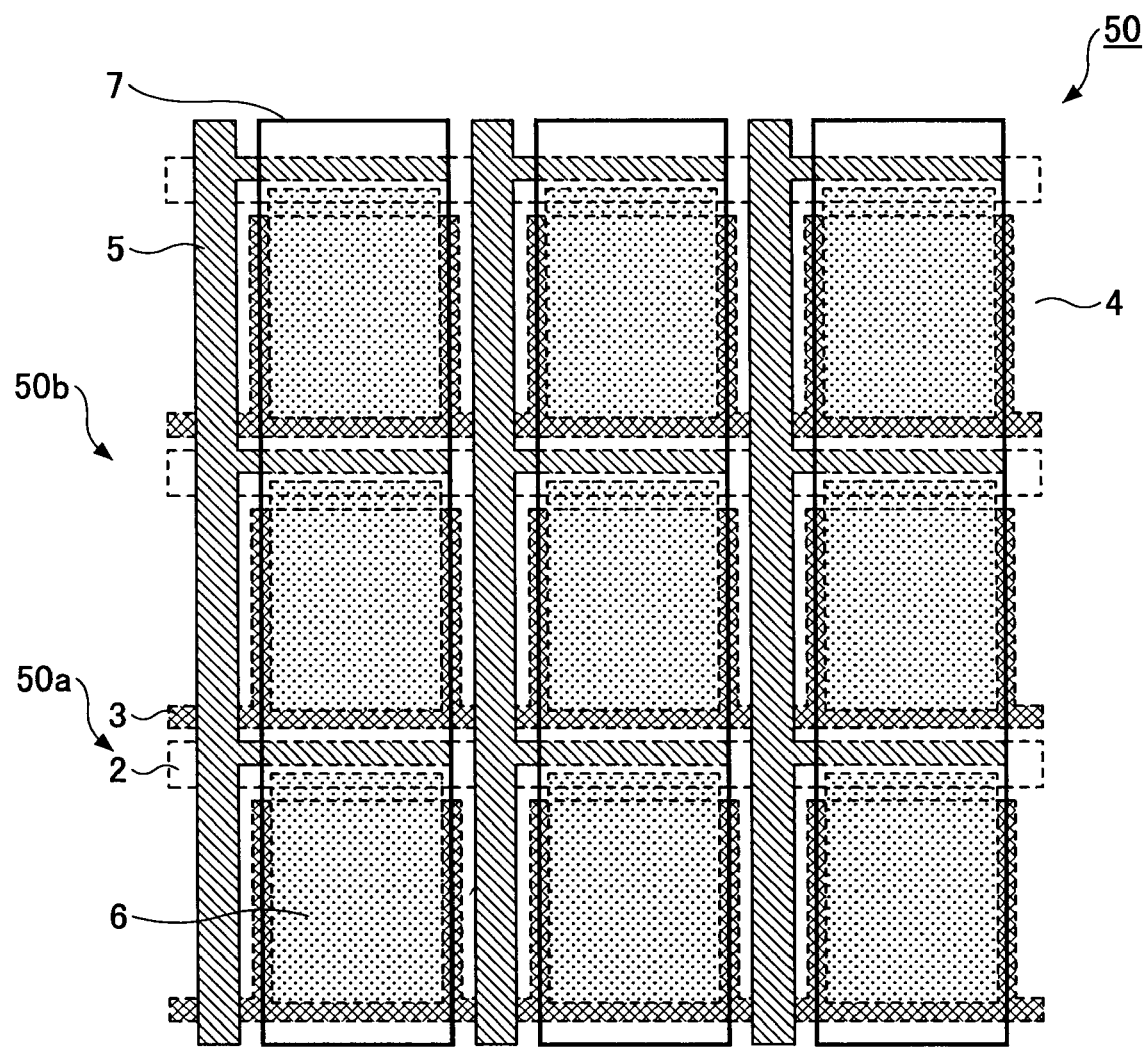
FIG. 5 shows a plan view of an organic transistor array according to another embodiment of the invention.

FIG. 5 shows an organic transistor array 50 according to a fifth embodiment of the present invention. The organic transistor array 50 is similar to the organic transistor array 10, with the exception of the organic semiconductor layer 7. While in the organic transistor arrays 10, 20, 30, and 40 the organic semiconductor layer is formed in islands, the organic transistor array 50 has the organic semiconductor layer 7 that is formed in stripes. In this way, patterning throughput by an inkjet print method can be improved. Because alignment accuracy needs to be considered only in one direction, yield can be improved and higher resolutions can be achieved.

Figure 9A:
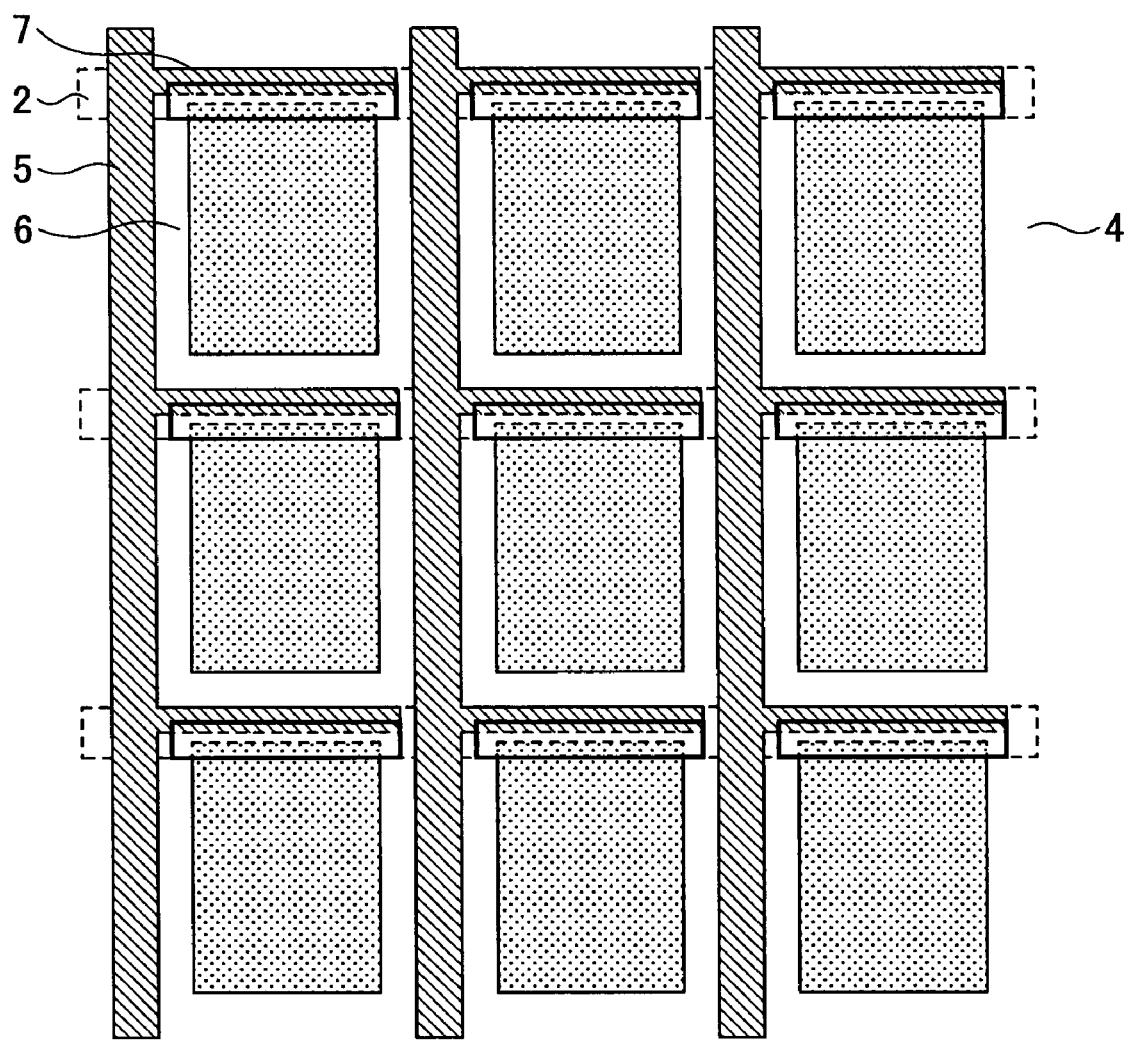
FIG. 9A shows a plan view of an organic transistor where a fine pattern is formed.
Figure 9B:
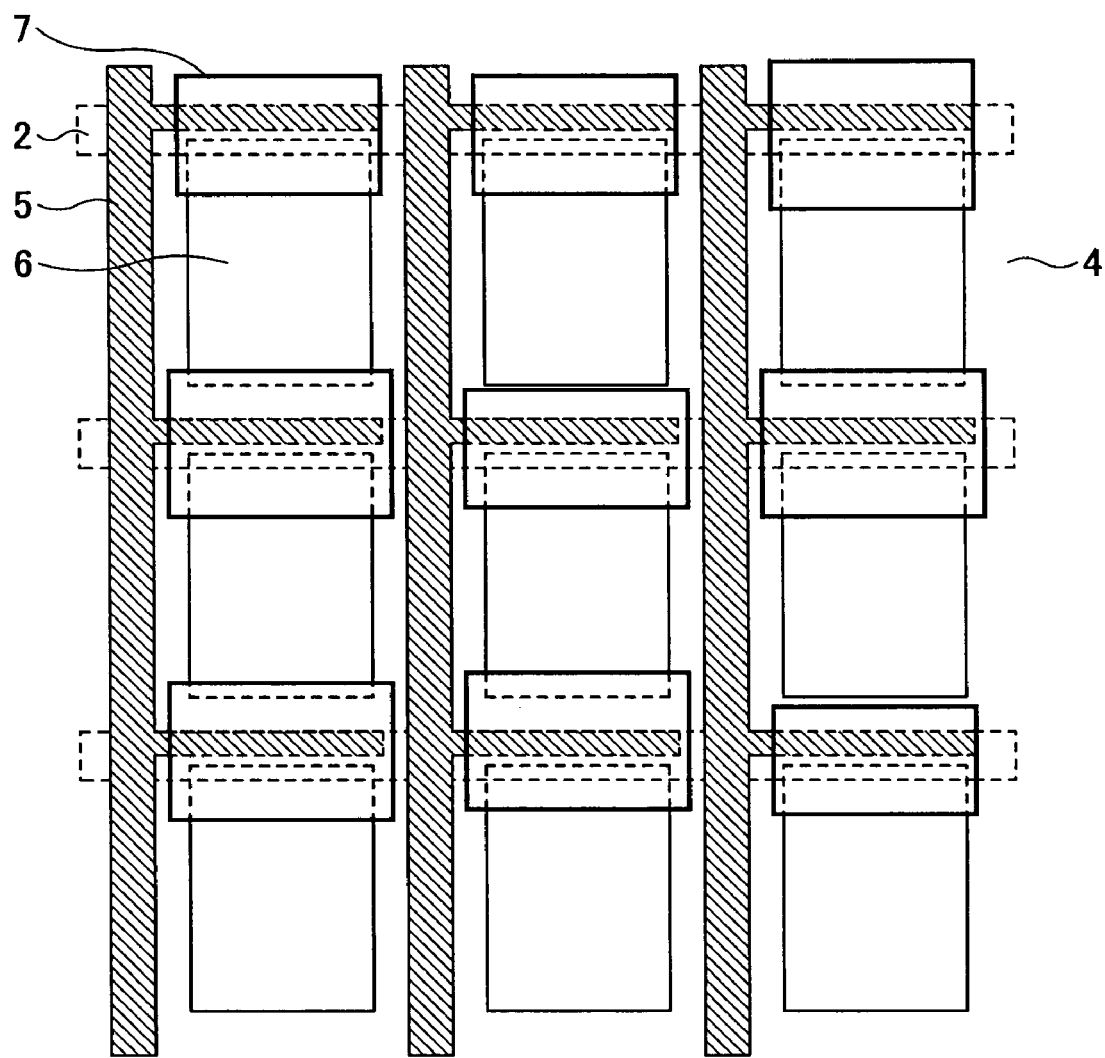
FIG. 9B shows a plan view of an organic transistor where an incomplete pattern is formed.

In a conventional organic transistor array, when an organic semiconductor layer 7 is formed by a print method such as an inkjet print method, it has been difficult to obtain a high-resolution pattern as shown in FIG. 9A, tending to result in an incomplete pattern as shown in FIG. 9B. An incomplete pattern tends to occur particularly when an area to be patterned is large. Specifically, the organic semiconductor layer 7 may fail to be separated into individual organic transistors that form an organic transistor array, resulting in one organic transistor affecting an adjacent organic transistor via the organic semiconductor layer 7. Such an incomplete patterning of the organic semiconductor layer 7 may be due to variations in head characteristics or skewed discharge from a nozzle. However, it is difficult to achieve a uniform discharge condition with regard to all nozzles. Furthermore, the drying condition after the landing of a droplet varies depending on the pattern shape, with the droplets extending in differing degrees depending on their individual drying condition. When a polymer solution is used as an ink for the organic semiconductor layer, the discharge rate may vary depending on changes in the physical property of the solution, thus making it difficult to perform high-resolution patterning.

When the patterning of the organic semiconductor layer 7 is incomplete, a leak current may flow via the organic semiconductor layer 7, resulting in an increase in off-current and a drop in the on/off ratio. Further, the incomplete patterning may lead to crosstalk between pixels when the organic transistor array is used to drive a display medium.

In accordance with various embodiments of the present invention, the organic semiconductor layer 7 is electrically separated by an electrical field effect of the separating electrode 3. Specifically, when the organic transistor is driven, a selection signal is applied to the gate electrode 2 while a data signal is applied to the source electrode 5. When the organic semiconductor layer 7 is of a p-type organic semiconductor, a positive voltage is applied to the separating electrode 3. When the organic semiconductor layer 7 is of an n-type organic semiconductor, a negative voltage is applied to the separating electrode 3. By the resultant electrical field effect, the organic semiconductor layer 7 can be actively depleted. As a result, a portion of the organic semiconductor layer 7 over the separating electrode 3 can be not physically but electrically shielded via the gate insulating film 4 or the interlayer insulating film 8. In this way, leak current can be blocked above the separating electrode 3, so that an increase in off-current can be prevented.

The position where the separating electrode 3 is formed is not particularly limited as long as it can electrically shield the organic semiconductor layer 7. Preferably, however, the separating electrode 3 is formed at the same layer level as the gate electrode 2, as shown in FIG. 1B, from the viewpoint of performance and the number of manufacturing steps, for example.

When a display medium is driven by driving the individual organic transistors of an organic transistor array by an active matrix method, it is necessary to form a retentive capacity in each organic transistor for maintaining a display status. The retentive capacity needs to be formed such that it is parallel with respect to the display medium in terms of an equivalent circuit. As an opposite electrode for forming such a retentive capacity, the separating electrode 3 can be utilized. Namely, the separating electrode 3 can be used to form a retentive capacity between the separating electrode 3 and the drain electrode 6 via the gate insulating film 3 or the interlayer insulating film 8, as well as to electrically separate the organic semiconductor layer 7.

Preferably, the separating electrode 3 is formed by a print method, such as a screen print method, an inkjet print method, a flexography method, a gravure print method, or an offset print method. For reasons of patterning accuracy, cost, and the number of steps, the separating electrode 3 is preferably formed by the same print method as used for the other electrodes formed in the same layer. A particularly preferable method is an inkjet print method, using, preferably, a metallic ink in which metal particles are dispersed. Examples of the metal particles include particles of Au, Ag, Cu, Pt, Pd, Ni, Ir, Rh, Co, Fe, Mn, Cr, Zn, Mo, W, Ru, In, and Sn; two or more of them may be combined. Among those mentioned above, Au, Ag, Cu, and Ni are preferable from the viewpoint of electric resistance, heat conductivity, and corrosion.

A metallic ink consists of a solvent in which metal particles with an average particle size on the order of several nanometers to several tens of nanometers are evenly dispersed. Such metal particles can be sintered because as the size of metal particles decreases, the influence of the atoms on the surface that have high activity increases. Thus, by placing a metallic ink by an inkjet-printing method and then sintering the ink, an electrode can be directly drawn. In this case, preferably the metallic ink has a surface tension of approximately 30 mN/m for allowing inkjet printing. Preferably, the metallic ink has a viscosity of 2 to 13 mPa·s and more preferably of 7 to 10 mPa·s. If the surface tension and viscosity of the metallic ink are inappropriate, failed or defective discharge of the ink may result, or the formation of a spherical ink droplet may be prevented, and furthermore the ligament may increase in length. The metallic ink is also required to have a degree of drying property such that the solvent does not evaporate upon discharge to thereby solidify the metal particles.

The separating electrode 3 may contain an conductive polymer. Examples of the conductive polymer include polythiophene, polyaniline, polypyrrole, polyparaphenylene, and polyacetylene. Any of the above polymers may be doped to be used as a conductive polymer. Among others, a complex (PEDOT/PSS) of polyethylenedioxythiophene (PEDOT) and polystyrene sulfonate (PSS) is preferable in terms of electrical conductivity, stability, and heat resistance. Because the electrical characteristics of a conductive polymer can be adjusted by the degree of polymerization and structure, and because it does not require sintering, an electrode can be formed at low temperatures.

The gate electrode 2, the source electrode 5, and the drain electrode 6 can be formed in the same way as the separating electrode 3.

Preferably, the organic semiconductor layer 7 is formed by a print method, such as a screen print method, an inkjet print method, a flexography method, a gravure print method, or an offset print method. For reasons such as patterning accuracy, cost, and material solubility, an inkjet print method is particularly preferable. In this case, the organic semiconductor layer 7 preferably contains an organic semiconductor material that is soluble in an organic solvent. In this way, the organic semiconductor layer 7 can be formed using an organic semiconductor ink in which an organic semiconductor material is dissolved in an organic solvent. Such an organic semiconductor material is not particularly limited; for example, a polymer material, an oligomer material, or a low-molecular-weight material may be used. Preferably, a polymer material having a triarylamine skeleton is used. Particularly preferable is a compound expressed by the following chemical formula (1):

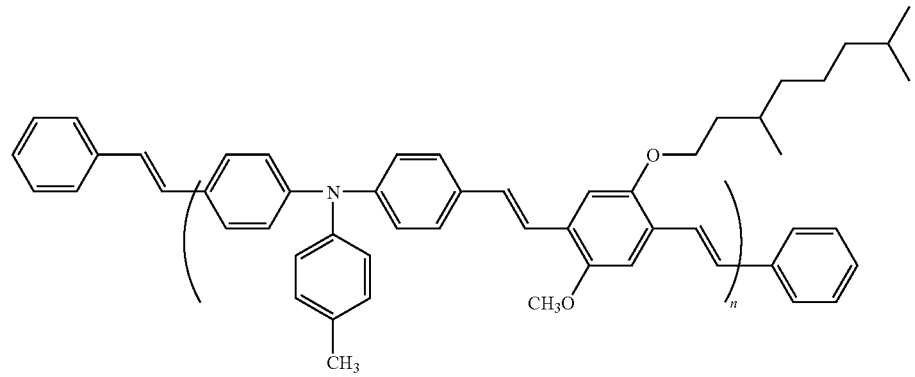

This polymer material is a nonoriented polymer material and has very little variations in characteristics regardless of the shape or method of film formation.

By combining an active matrix substrate in which the organic transistor array according to an embodiment of the present invention is used as an active matrix element with pixel display elements, a display panel (active matrix display apparatus) having excellent flexibility characteristics can be fabricated.

In the following, a method of manufacturing an active matrix display apparatus is described with reference to FIGS. 1A and 1B. First, a glass substrate (or a film substrate) 1 is inkjet-printed using an Ag ink in which Ag particles are dispersed, in order to form the gate electrode 2 and the separating electrode 3, as shown in FIG. 1. Polyamic acid is then spin-coated and sintered, forming the gate insulating film 4. The gate insulating film 4 is then irradiated with ultraviolet light via a photomask, forming a high-energy pattern on the surface. The high-energy pattern is inkjet-printed using an Ag ink in which Ag particles are dispersed, in order to form the source electrode 5 and the drain electrode 6. Further, islands of an organic semiconductor layer 7 are formed by inkjet printing using an organic semiconductor ink. Thereafter, a protection layer (not shown) of paraxylylene is formed to a thickness of 2 μm by chemical vapor deposition (CVD), thereby obtaining an active matrix substrate.

On an counter substrate, a film of indium tin oxide (ITO) is formed by sputtering to a thickness on the order of 100 nm, thereby forming a transparent conductive film. The transparent conductive film is coated with polyamic acid by spin coating, and then rubbing is performed to form an oriented film having a thickness on the order of 200 nm. After an orientation treatment, the active matrix substrate and a silica spacer are disposed and joined with the counter substrate, and a liquid crystal material is hermetically sealed in the gap, thereby obtaining a liquid crystal panel.

Another example of a display panel other than the liquid crystal panel is an electrophoretic display panel, which can be obtained by placing the active matrix substrate and a silica spacer on a counter substrate on which a transparent conductive film is formed, and then hermetically sealing a microcapsule-type electrophoretic element in the gap. Further, an organic EL panel can be obtained by forming organic EL elements on the active matrix substrate as display pixels and placing an atmosphere blocking shield thereon.

EXAMPLES

In the following, the present invention is described in greater detail with reference to examples. It should be noted that the present invention is not limited by any of the following examples.

Example 1

Figure 6:
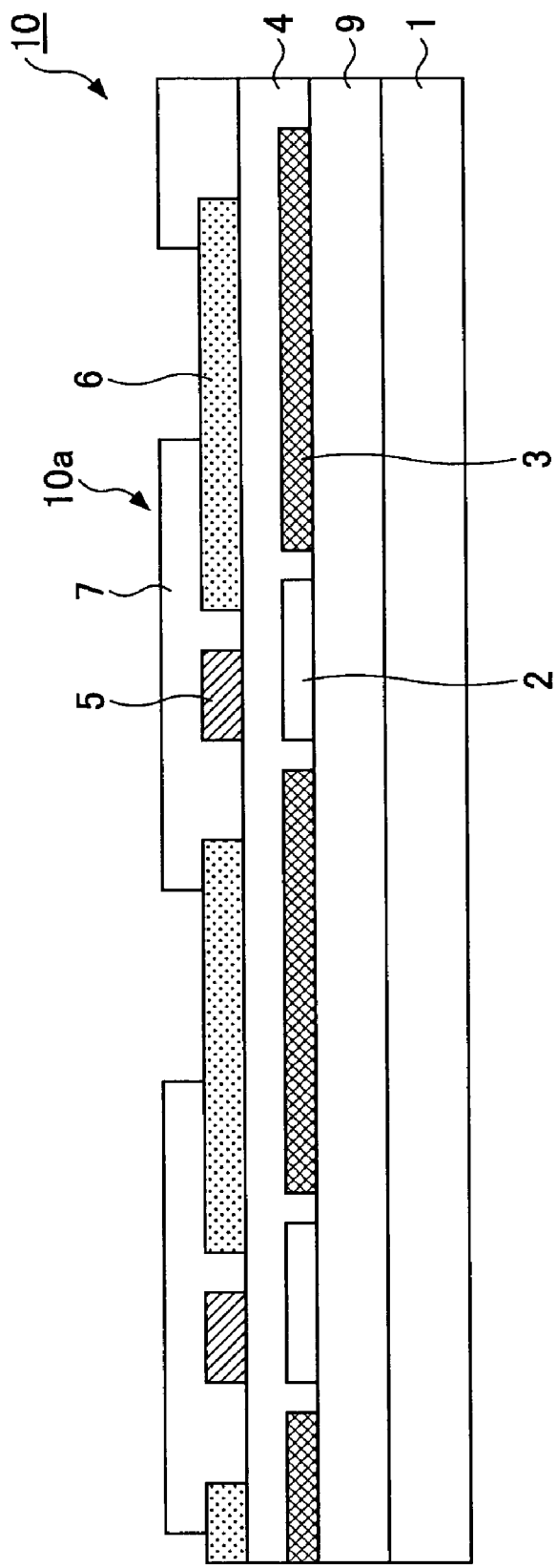
FIG. 6 shows a cross section of an organic transistor array according to Example 1.

Reference is made to FIG. 6. A glass substrate 1 was spin-coated with polyamic acid, and then a heat treatment was performed at 280° C., thereby forming an insulating film 9 having a film thickness of 200 nm. The surface was then irradiated with ultraviolet light using an UV lamp (amount of irradiation: 7 J/cm$^2$) via a photomask, forming a high-energy pattern on the surface. An Ag ink in which Ag particles were dispersed was then discharged onto the high-energy pattern by an inkjet print method. This was followed by sintering at 280° C., thereby forming a gate electrode 2 and a separating electrode 3 having a film thickness of 100 nm. These were then spin-coated with a polyamic acid and a heat treatment was performed at 280° C., forming a gate insulating film 4 with a film thickness of 500 nm. Further, a high-energy pattern was formed on the surface using a UV lamp (amount of irradiation: 7 J/cm$^2$) via a photomask. Then, an Ag ink was discharged onto the high-energy pattern by an inkjet print method and sintering was performed at 280° C., whereby a source electrode 5 and a drain electrode 6 were formed to a film thickness of 100 nm. The resultant channel width was 140 μm, and the channel length was 10 μm. An organic semiconductor layer 7 (see FIG. 1A) was then formed in islands by applying an organic semiconductor ink, in which the compound expressed by chemical formula (1) was dissolved in tetralin, by a spin-coat method, thereby obtaining an organic transistor array.

Figure 7:
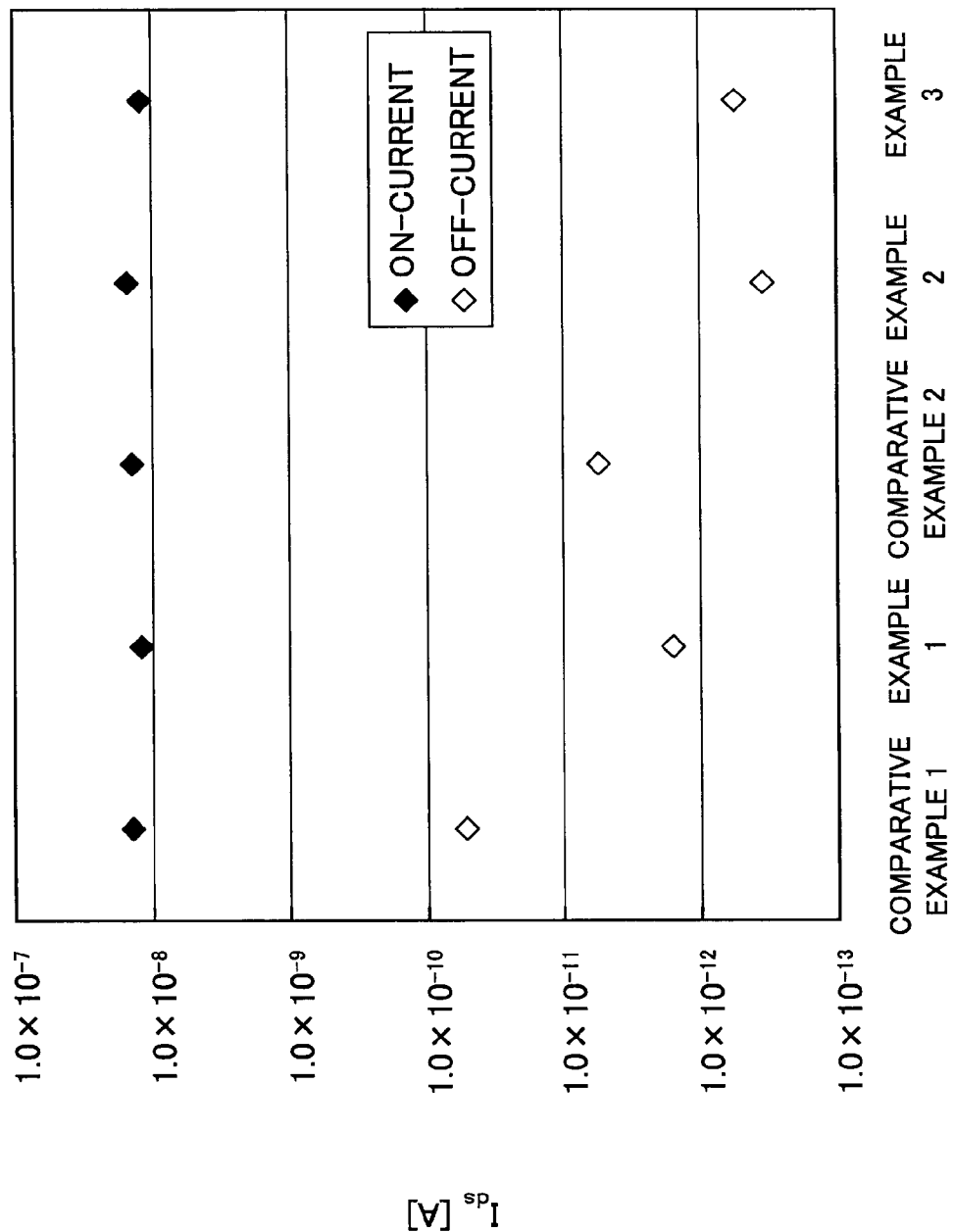
FIG. 7 shows transistor characteristics in a controlled atmosphere.

The transistor characteristics of the resultant organic transistor array was measured in an atmosphere of less than 1 ppm oxygen and less than 1 ppm water content. Specifically, gate voltage $V_g$ was scanned between +20 V and −20 V while +20 V was applied to the separating electrode, with drain voltage $V_{ds}$ at −20 V. As a result, drain current $I_{ds}$ (on-current) was −1.2×10$^{-8}$ A when $V_g$ was −20 V, and drain current $I_{ds}$ (off-current) was −1.6×10$^{-12}$ A when $V_g$ was +20 V (see FIG. 7). Thus, the on/off ratio was 7.3×10$^3$.

Comparative Example 1

An organic transistor array was fabricated in the same way as in Example 1 with the exception that the separating electrode 3 was not formed.

The transistor characteristics of the resultant organic transistor array was measured in an atmosphere of less than 1 ppm oxygen and less than 1 ppm water content. Specifically, gate voltage $V_g$ was scanned between +20 V and −20 V, with drain voltage $V_{ds}$ at −20 V. As a result, drain current $I_{ds}$ (on-current) was −1.4×10$^{-8}$ A when $V_g$ was −20 V, and drain current $I_{ds}$ (off-current) was −5.1×10$^{-11}$ A when $V_g$ was +20 V (see FIG. 7). Thus, the on/off ratio was 2.7×10$^2$.

Thus, it can be see that in Example 1, the off-current was reduced compared with Comparative Example 1 and the on/off ratio was improved, resulting in good transistor characteristics.

Example 2

An organic transistor array was obtained in the same way as in Example 1 with the exception that an organic semiconductor ink was printed by an inkjet method.

The transistor characteristics of the resultant organic transistor array was measured in an atmosphere of less than 1 ppm oxygen and less than 1 ppm water content. Specifically, gate voltage $V_g$ was scanned between +20 V and −20 V while +20 V was applied to the separating electrode, with drain voltage $V_{ds}$ at −20 V. As a result, drain current $I_{ds}$ (on-current) was −1.5×10$^{-8}$ A when $V_g$ was −20 V, and drain current $I_{ds}$ (off-current) was −3.5×10$^{-13}$ A when $V_g$ was +20 V (see FIG. 7). Thus, the on/off ratio was 4.4×10$^4$.

It can be seen that in Example 2, the off-current was further reduced compared with Example 1 and the on/off ratio was further improved, resulting in good transistor characteristics.

Comparative Example 2

An organic transistor array was obtained in the same way as in Example 2 with the exception that the separating electrode 3 was not formed.

The transistor characteristics of the resultant organic transistor array was measured in an atmosphere of less than 1 ppm oxygen and less than 1 ppm water content. Specifically, gate voltage $V_g$ was scanned between +20 V and −20 V, with drain voltage $V_{ds}$ at −20 V. As a result, drain current $I_{ds}$ (on-current) was −1.4×10$^{-8}$ A when $V_g$ was −20 V, and drain current $I_{ds}$ (off-current) was −5.5×10$^{-12}$ A when $V_g$ was +20 V (see FIG. 7). Thus, the on/off ratio was 2.5×10$^3$.

Thus, it can be seen that in Example 2, the off-current was further reduced compared with Comparative Example 2 and the on/off ratio was improved, resulting in good transistor characteristics.

Example 3

An organic transistor array was obtained in the same way as in Example 2 with the exception that the organic semiconductor layer 7 was formed in a stripes (see FIG. 5).

The transistor characteristics of the resultant organic transistor array was measured in an atmosphere of less than 1 ppm oxygen and less than 1 ppm water content. Specifically, gate voltage $V_g$ was scanned between +20 V and −20 V while +20 V was applied to the separating electrode, with drain voltage $V_{ds}$ at −20 V. As a result, drain current $I_{ds}$ (on-current) was −1.2×10$^{-8}$ A when $V_g$ was −20 V, and drain current $I_{ds}$ (off-current) was −5.5×10$^{-13}$ A when $V_g$ was +20 V (see FIG. 7). Thus, the on/off ratio was 2.1×10$^{4}$.

Thus, it can be seen that the off-current was reduced and the on/off ratio was improved as in Example 2, resulting in good transistor characteristics.

Comparative Example 3

Figure 8:
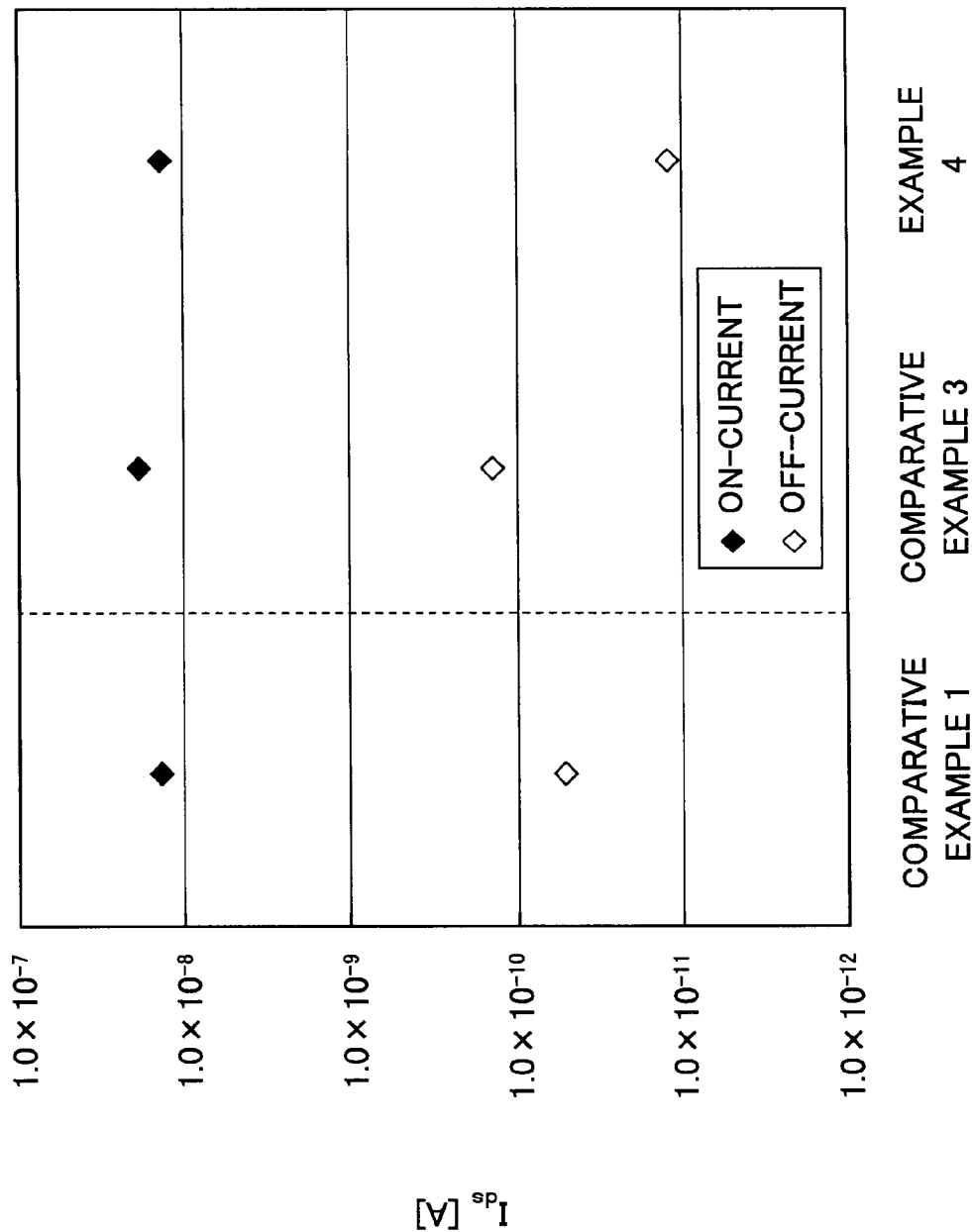
FIG. 8 shows transistor characteristics in the atmosphere.

The transistor characteristics of the resultant organic transistor array obtained in Comparative Example 1 was measured in the atmosphere. Specifically, gate voltage $V_g$ was scanned between +20 V and −20 V, with drain voltage $V_{ds}$ at −20 V. As a result, drain current $I_{ds}$ (on-current) was −1.9×10$^{-8}$ A when $V_g$ was −20 V, and drain current $I_{ds}$ (off-current) was −1.4×10$^{-10}$ A when $V_g$ was +20 V (see FIG. 8). Thus, the on/off ratio was 1.3×10$^{2}$. FIG. 8 also shows the result of Comparative Example 1 of FIG. 6 for comparison purposes.

It can be seen that in Comparative Example 3, the off-current is increased and the on/off ratio is reduced compared with Comparative Example 1.

Example 4

The transistor characteristics of the resultant organic transistor array obtained in Example 1 were measured in the atmosphere. Specifically, gate voltage $V_g$ was scanned between +20 V and −20 V while +20 V was applied to the separating electrode, with drain voltage $V_{ds}$ at −20 V. As a result, drain current $I_{ds}$ (on-current) was −1.4×10$^{-8}$ A when $V_g$ was −20 V, and drain current $I_{ds}$ (off-current) was −1.2×10$^{-11}$ A when $V_g$ was +20 V (see FIG. 8). Thus, the on/off ratio was 1.1×10$^{3}$.

Thus, it can be seen that in Example 4, the off-current was reduced and the on/off ratio was improved over Comparative Example 3, resulting in good transistor characteristics.

Example 5

On the organic transistor array according to Example 1, a protection layer of poly-para-xylylene was formed to a thickness of 2 μm by CVD, thereby obtaining an active matrix substrate.

On a film substrate, a layer of indium tin oxide (ITO) was formed by sputtering to a thickness of 100 nm, thereby fabricating a film substrate having a transparent conductive film.

Meanwhile, 20 parts by weight of titanium oxide, 1 part by weight of acid polymer, 2 parts by weight of silicone polymer graft carbon black MX3-GRX-001 (manufactured by Nippon Shokubai Co., Ltd.), and 77 parts by weight of silicone oil KF96L-1cs (manufactured by Shin-Etsu Chemical Co., Ltd.) were mixed and then dispersed by ultrasound for an hour, whereby a white/black particles dispersion was prepared. The resultant white/black particles dispersion was made into microcapsules by a gelatin-acacia complex coacervation method. The microcapsule had an average particle size of approximately 60 μm. Then, using a wire blade method, a dispersion of the microcapsules in a urethane resin solution was expanded over the transparent electrode film-attached film substrate, whereby a microcapsule sheet was fabricated.

The microcapsule sheet was then joined to the active matrix substrate to fabricate an electrophoretic display panel.

The present application is based on the Japanese Priority Application No. 2007-182445 filed Jul. 11, 2007, the entire contents of which are hereby incorporated by reference.

What is claimed is:

1. An organic transistor comprising:
   a gate electrode, a source electrode, and a drain electrode formed on a substrate;
   an insulating film;
   an organic semiconductor layer; and
   a separating electrode,
   wherein the organic semiconductor layer and the separating electrode are laminated via the insulating film in a first region, and a power supply is connected to the separating electrode.

2. The organic transistor according to claim 1, wherein the power supply is configured to apply a voltage to the separating electrode such that the organic semiconductor layer is electrically shielded.

3. The organic transistor according to claim 1, wherein the drain electrode and the separating electrode are laminated via the insulating film in a second region.

4. The organic transistor according to claim 1, wherein the separating electrode is formed by a print method.

5. The organic transistor according to claim 1, wherein the separating electrode is formed using an ink in which metal particles are dispersed.

6. The organic transistor according to claim 1, wherein the separating electrode contains a conductive polymer.

7. The organic transistor according to claim 1, wherein the organic semiconductor layer is formed in an island shape or in a stripe shape.

8. The organic transistor according to claim 1, wherein the organic semiconductor layer is formed by a print method.

9. The organic transistor according to claim 1, wherein the organic semiconductor layer contains an organic semiconductor material that is soluble in an organic solvent.

10. The organic transistor according to claim 9, wherein the organic semiconductor material comprises a polymer material that has a triarylamine skeleton.

11. An organic transistor array having plural of the organic transistors according to claim 1.

12. The organic transistor array according to claim 11, wherein the drain electrode and the separating electrode are laminated via the insulating film in a second region, and the first region and the second region are continuously formed.

13. A display apparatus having the organic transistor array according to claim 11.

* * * * *